(12) United States Patent  
Shafer et al.

(10) Patent No.: US 6,930,837 B2  
(45) Date of Patent: Aug. 16, 2005

(54) OPTICAL PROJECTION LENS SYSTEM

(75) Inventors: David R. Shafer, Fairfield, CT (US); Wilhelm Ulrich, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/833,840

(22) Filed: Apr. 27, 2004

(65) Prior Publication Data

US 2004/0201899 A1 Oct. 14, 2004

Related U.S. Application Data

(63) Continuation of application No. 10/393,593, filed on Mar. 30, 2003, now Pat. No. 6,791,761, which is a continuation of application No. 09/694,878, filed on Oct. 23, 2000, now Pat. No. 6,560,031.
(60) Provisional application No. 60/160,799, filed on Oct. 21, 1999.

(51) Int. Cl.[7] .................................................. G02B 3/00
(52) U.S. Cl. .......................... 359/649; 359/754; 359/683
(58) Field of Search ................................ 359/649, 683, 359/690, 754, 785

(56) References Cited

U.S. PATENT DOCUMENTS

| | | | |
|---|---|---|---|
| 4,506,958 A | 3/1985 | Imai | 350/427 |
| 5,059,006 A | 10/1991 | Kikuchi et al. | 350/426 |
| 5,260,832 A | 11/1993 | Togino et al. | 359/679 |
| 5,398,064 A | 3/1995 | Saka | 348/347 |
| 5,414,561 A | 5/1995 | Wakimoto et al. | 359/663 |
| 5,623,365 A | 4/1997 | Kuba | 359/569 |
| 5,636,000 A | 6/1997 | Ushida et al. | 355/30 |
| 5,696,631 A | 12/1997 | Hoffman | 359/649 |
| 5,856,884 A | 1/1999 | Mercado | 359/649 |
| 5,969,803 A | 10/1999 | Mercado | 355/67 |
| 5,986,824 A | 11/1999 | Mercado | 359/754 |

(Continued)

FOREIGN PATENT DOCUMENTS

| | | | |
|---|---|---|---|
| EP | 0 816 892 A | 1/1998 | G02B/17/08 |
| EP | 1 235 092 A2 | 8/2002 | G02B/13/14 |
| EP | 1 237 043 A2 | 9/2002 | G03F/7/20 |
| EP | 1 245 984 A2 | 10/2002 | G02B/13/14 |
| GB | 1088192 | 10/1967 | G02B/3/04 |
| JP | 10-282411 | 10/1998 | G02B/13/24 |
| JP | 10-325922 | 12/1998 | G02B/13/24 |
| JP | 11-006957 | 1/1999 | G02B/13/24 |
| JP | 11-095095 | 4/1999 | G02B/13/24 |
| JP | 11-214293 | 8/1999 | H01L/21/027 |

OTHER PUBLICATIONS

Bruning, John H. et al., "Optical Lithography—Thirty years and three orders of magnitude, The evolution of optical lithography tools", *SPIE*, vol. 3049, pp. 14–27 (1997).

(Continued)

*Primary Examiner*—Georgia Epps
*Assistant Examiner*—M. Hasan

(57) ABSTRACT

An optical projection lens system for microlithography comprising in the direction of propagating radiation: a first lens group having positive refractive power, a second lens group having negative refractive power and comprising a waist (constriction) with a minimum diameter of the propagating radiation, and a further lens arrangement with positive refractive power, which follows the second lens group, wherein at least one lens of the projection lens system which is arranged in front of the waist comprises an aspherical surface.

34 Claims, 1 Drawing Sheet

U.S. PATENT DOCUMENTS

| | | | |
|---|---|---|---|
| 5,990,926 A | 11/1999 | Mercado | 347/258 |
| 6,008,884 A | 12/1999 | Yamaguchi et al. | 355/53.54 |
| 6,084,723 A | 7/2000 | Matsuzawa et al. | 359/754 |
| 6,088,171 A | 7/2000 | Kudo | 359/754 |
| 6,166,865 A | 12/2000 | Matsuyama | 359/690 |
| 6,185,050 B1 | 2/2001 | Ota et al. | 359/691 |
| 6,198,576 B1 | 3/2001 | Matsuyama | 359/649 |
| 6,259,508 B1 | 7/2001 | Shigematsu | 355/53 |
| 6,259,569 B1 | 7/2001 | Kasai | 259/690 |
| 6,349,005 B1 | 2/2002 | Schuster et al. | 359/754 |
| 6,377,338 B1 | 4/2002 | Suenaga | 355/67 |
| 6,512,633 B2 | 1/2003 | Konno et al. | 359/557 |
| 6,538,821 B2 | 3/2003 | Takahashi | 359/649 |
| 6,560,031 B1 | 5/2003 | Shafer et al. | 359/649 |
| 6,606,144 B1 | 8/2003 | Omura | 355/67 |
| 6,674,513 B2 | 1/2004 | Omura | 355/67 |
| 2003/0086183 A1 | 5/2003 | Wagner et al. | 359/649 |
| 2003/0179356 A1 * | 9/2003 | Schuster et al. | 355/67 |
| 2003/0206282 A1 * | 11/2003 | Omura | 355/67 |
| 2004/0120051 A1 * | 6/2004 | Schuster | 359/649 |

OTHER PUBLICATIONS

Buckley, Jere D. et al., "Step and Scan: A systems overview of a new lithography tool", *SPIE*, vol. 1088, pp. 424–433 (1989).

Glatzel, E., "New Developments in Photographic Objectives", *Offprint from Optical Instruments and Techniques*, Oriel Press, pp. 413–415 (1969).

Glatzel, Erhard, "New Lenses for Microlithography", *SPIE*, vol. 237, pp. 310–320 (1980).

Sheats, James R. et al., *Microlithography Science and Technology*, pp. 263–270.

Wöltche, Walter, "Optical Systems Design with Reference to the Evolution of the Double Gauss Lens", *SPIE*, vol. 237, pp. 202–215 (1980).

Sheats, James R. et al., *Microlithography Science and Technology*, pp. 263–270.

\* cited by examiner

OPTICAL PROJECTION LENS SYSTEM

CROSS-REFERENCE TO RELATED APPLICATIONS

Pursuant to 35 U.S.C. 120, the application is a continuation of and claims the benefit of prior U.S. application Ser. No. 10/393,593, filed Mar. 30, 2003, now U.S. Pat. No. 6,791,761 B2 issued on Sep. 14, 2004, which is a continuation of and claims the benefit of prior U.S. application Ser. No. 09/694,878, filed Oct. 23, 2000, now U.S. Pat. No. 6,560,031, issued on May 6, 2003, which, in turn, claims the benefit under 35 U.S.C. 119 (e) of prior U.S. provisional application 60/160,799, filed Oct. 21, 1999. The contents of the prior application are incorporated herein by reference in their entirety.

STATEMENT REGARDING FEDERALLY SPONSORED RESEARCH OR DEVELOPMENT

Not applicable.

BACKGROUND OF THE INVENTION

This invention generally relates to an optical projection system comprising a light source, a mask holder, a projection lens system, and specifically relates to an optical projection system for photolithography used in producing microstructured devices, i.e., microlithography, such as integrated circuits or other semiconductor devices. During the fabrication of such devices, photolithography transfers an image from a photographic mask to a resultant pattern on a semiconductor wafer. Such photolithography generally includes a light exposure process, in which a semiconductor wafer is exposed to light having information of a mask pattern. Optical projection systems are used to perform the light exposure process.

In general, the transferred mask patterns are very fine, so that optical projection lens systems are required to have a high resolution. The high resolution necessitates a large numerical aperture of the optical projection lens system and also nearly no aberration of the optical projection lens system in the light exposure field.

For example, some projection lens systems are proposed in the German Patent Application DE 198 18 444 A1. The shown projection lens system comprises 6 lens groups. The first, third, fifth and sixth lens groups have positive refractive power and the second and fourth lens groups have negative refractive power. To get a high resolution in all shown examples, aspherical surfaces are in the fourth and fifth lens groups.

Some purely refractive projection exposure objectives of microlithography are discussed in SPIE Vol. 237 (1980), page 310 ff. There are shown objectives of the planar style and the distagon style, wherein the new style of objective comprises two waists for setzval correction.

SUMMARY OF THE INVENTION

It is an object of this invention to provide a further excellent optical projection lens system for photolithography.

The optical projection lens system of the invention comprises in a direction of the light (propagating radiation) a first lens group having positive refractive power and a second lens group having negative refractive power and establishing a beam waist (i.e., constriction) of minimal beam height. A further lens arrangement follows the second lens group. At least one lens, which is arranged before the first beam waist, has an aspherical surface. Further, lenses comprising aspherical surfaces in all other groups will be helpful to reduce the needed amount of material and to reduce the length of the optical projection lens system.

DETAILED DESCRIPTION OF THE INVENTION

Figure 1:
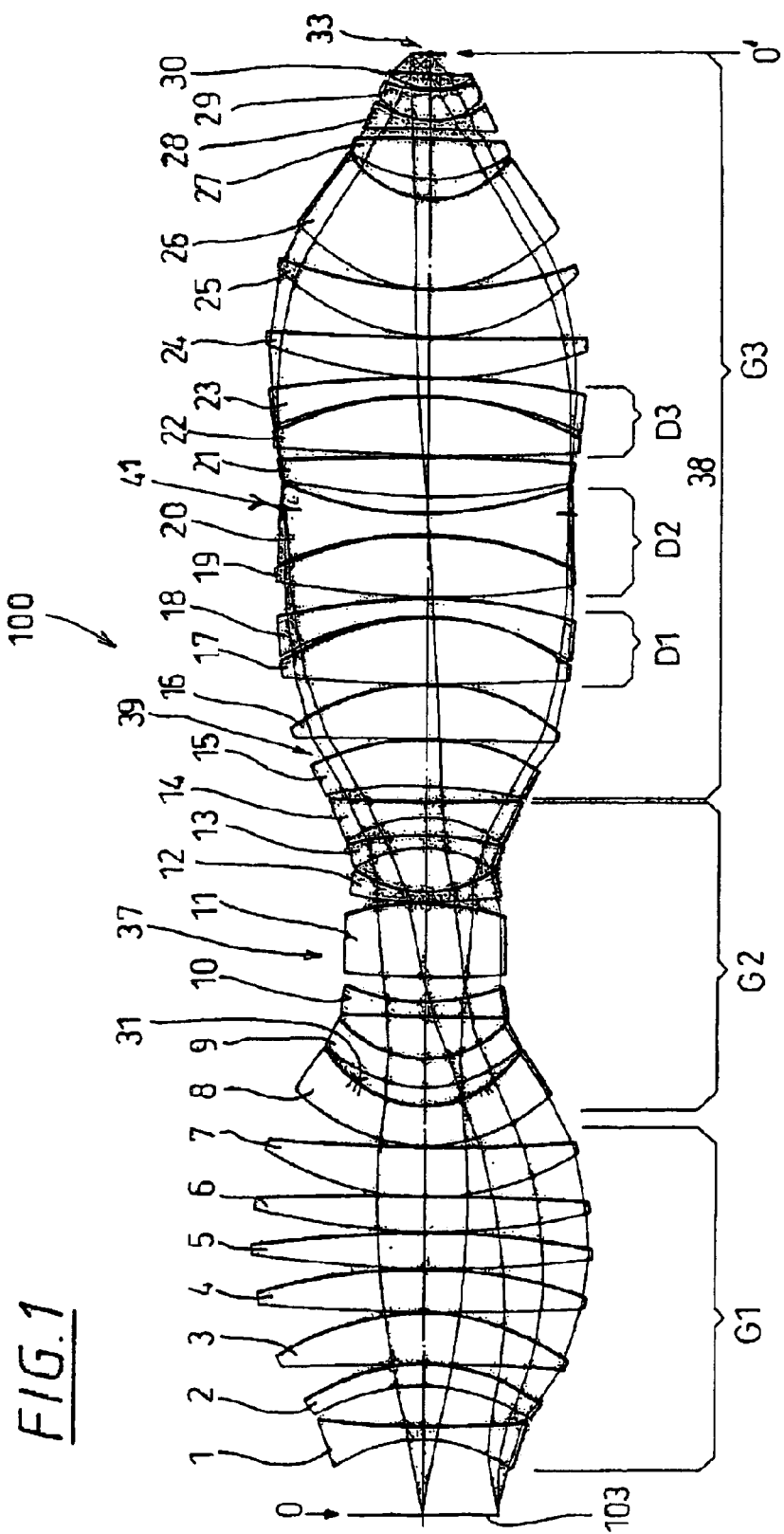
FIG. 1 is a cross section of an optical projection lens system according to an embodiment of the invention with only one clearly defined waist (i.e., constriction).

The optical projection lens system, shown in FIG. 1 comprises 30 lenses 1–30. This shown projection lens system is for wafer manufacture (i.e., a microlithography system). For illuminating a mask 103, which is positioned at 0, a light source with a narrow bandwidth is used. In this example, an excimer laser, which is not shown in the drawing, is used. The shown projection lens system is capable of being operated at 193.3 nm with a high numerical aperture of 0.7. This projection lens system is also adaptable to be operated at $\lambda=248$ nm or $\lambda 157$ nm.

A projection system comprising with this projection lens system the scale of the mask 103 projected on a wafer is reduced, wherein the wafer is positioned on 0'. The factor of scale reduction is 4 and the distance of 0 to 0' is 1000 mm. The illuminated image field is rectangular, e.g. 7 times 20 to 15 times 30 $mm^2$.

The present invention will be more fully understood from the detailed description given below and the accompanying drawing.

In the direction of propagating radiation, this projection lens system comprises a first lens group G1 comprising lenses 1 to 7 and a second lens group G2 comprising lenses 8 to 14, and a further lens arrangement G3 comprising lenses 15 to 30. The first lens group G1, has positive refractive power and ends with a lens 7 of refractive power.

The first lens 8 of the second lens group G2 is the first lens 8 behind the first belly of the projection lens system 100, which has a concave shaped lens surface 31 on the image side. In the example shown, this concave surface 31 has an aspherical shape. This aspherical surface 31 helps to reduce the track length, the number of needed lenses and helps to get a high image quality over the whole illuminated image field.

This second lens group G2 has negative refractive power and comprises a clearly defined waist portion (i.e., constriction) 37, which comprises seven lenses. The high number of lenses are needed for petzval correction, because there is only one clearly defined waist. There are three negative lenses 8–10 arranged in front of a lens 11 of positive refractive power in the middle of the lens group G2. Behind this positive lens 11 there are three further negative lenses 12–15.

The first lens 15 of the following lens arrangement G3 has positive refractive power. This is the first lens 15 of positive refractive power behind the lens 11 in the middle of the lens group G2. This lens arrangement G3 has positive refractive power and comprises lenses 15–30 of different materials and an aperture stop 41.

$CaF_2$ lenses 16, 17, 19, 21, 22, 29 and 30 are especially used. The other lenses are of quartz glass. These $CaF_2$ lenses are especially used for correction of chromatic aberration. This system comprises doublets D1, D2 and D3, which comprise a $CaF_2$ lens with positive refractive power followed by a quartz glass lens of negative refractive power. If no correction of chromatic aberration is required, as is usual in 248 nm systems, or possible with very narrow laser bandwidth, single lenses of the doublets D1–D3 can be taken, with the advantage of reducing the needed material and lenses.

A very shallow waist 38 is recognizable between lens 20 and lens 21.

The lens arrangement G3 has a maximum diameter of 238 mm.

The lens data of this embodiment are listed in the following Table 1. The aspheric surface is described mathematically by:

$$P(h) = \frac{\delta * h^2}{1 + \sqrt{(1-(1-EX)*\delta*h^2)}} + C_1 h^4 + \ldots + C_n h^{2n-2}$$

with $\delta = 1/R$, wherein R is paraxial curvature and P is the sag as a function of the radius h.

TABLE 1

| LENS | RADIUS | THICKNESS | GLASS |
|---|---|---|---|
|  | UNENDL | 17.52 |  |
| L1 | −116.39 | 10.00 | SiO$_2$ |
|  | 617.53 | 31.49 |  |
| L2 | −143.96 | 15.00 | SiO$_2$ |
|  | −158.71 | 0.50 |  |
| L3 | −1180.69 | 37.72 | SiO$_2$ |
|  | −191.12 | 0.50 |  |
| L4 | 2484.02 | 31.18 | SiO$_2$ |
|  | −409.87 | 0.50 |  |
| L5 | 864.05 | 28.13 | SiO$_2$ |
|  | −720.08 | 0.50 |  |
| L6 | 566.89 | 25.00 | SiO$_2$ |
|  | −5256.53 | 0.50 |  |
| L7 | 230.42 | 36.66 | SiO$_2$ |
|  | 1542.90 | 0.50 |  |
| L8 | 132.99 | 31.60 | SiO$_2$ |
|  | 84.39 | 12.54 |  |
| L9 | 101.03 | 22.70 | SiO$_2$ |
|  | 80.07 | 30.80 |  |
| L10 | −7281.27 | 10.00 | SiO$_2$ |
|  | 139.12 | 20.25 |  |
| L11 | 962.49 | 53.36 | SiO$_2$ |
|  | −190.49 | 0.50 |  |
| L12 | 348.09 | 9.00 | SiO$_2$ |
|  | 96.42 | 32.28 |  |
| L13 | −94.72 | 11.00 | SiO$_2$ |
|  | −203.97 | 14.37 |  |
| L14 | −91.49 | 13.00 | SiO$_2$ |
|  | 4787.89 | 10.28 |  |
| L15 | −329.06 | 36.69 | SiO$_2$ |
|  | −173.40 | 0.50 |  |
| L16 | −2176.02 | 40.00 | CaF$_2$ |
|  | −161.94 | 1.00 |  |
| L17 | 1885.09 | 50.00 | CaF$_2$ |
|  | −195.36 | 0.48 |  |
| L18 | −198.97 | 15.00 | SiO$_2$ |
|  | −389.14 | 0.50 |  |
| L19 | 687.29 | 45.10 | CaF$_2$ |
|  | −254.11 | 0.10 |  |
| L20 | −261.96 | 15.00 | SiO$_2$ |
|  | 261.17 | 13.27 |  |
| L21 | 530.40 | 32.00 | CaF$_2$ |
|  | −1166.11 | 0.50 |  |
| L22 | 1879.17 | 45.00 | CaF$_2$ |
|  | −237.88 | 0.10 |  |
| L23 | −271.21 | 15.00 | SiO$_2$ |
|  | −609.73 | 0.50 |  |
| L24 | 351.48 | 30.00 | SiO$_2$ |
|  | 100200.00 | 0.50 |  |
| L25 | 157.95 | 34.26 | SiO$_2$ |
|  | 329.33 | 0.50 |  |

TABLE 1-continued

| LENS | RADIUS | THICKNESS | GLASS |
|---|---|---|---|
| L26 | 125.26 | 67.46 | SiO$_2$ |
|  | 69.91 | 16.27 |  |
| L27 | 102.35 | 30.27 | SiO$_2$ |
|  | −1072.95 | 7.25 |  |
| L28 | −914.82 | 5.00 | SiO$_2$ |
|  | 63.74 | 0.50 |  |
| L29 | 53.45 | 23.33 | CaF$_2$ |
|  | 82.67 | 0.50 |  |
| L30 | 60.16 | 10.70 | CaF$_2$ |
|  | 1256.42 | 15.34 |  |

Aspheric Constants
EX = 0.139140 * 10$^{-8}$
$C_1$ = 0.178710 * 10−12−
$C_2$ = 0.601290 * 10$^{-17}$
$C_3$ = 0.253200 * 10$^{-20}$ The maximum beam diameter is 238 mm ad the track length is 1000 mm, wherein the numerical aperture is NA=0.7. This results in a very compact construction with reduced cost for lens material.

The implementation of CaF$_2$ lenses 16, 17, 19, 21, 22 effects a good correction of chromatic aberration of this compact embodiment. The last two CaF$_2$ lenses 29, 30 at the end of the lens arrangement G3 are inserted for their resistance versus compaction.

As those skilled in the art of optical projection lens systems will readily appreciate, numerous substitutions, modifications and additions may me made to the above design without departing from the spirit and scope of the present invention. It is intended that all such substitutions, modifications, and additions fall within the scope of the invention, which is defined by the claims.

We claim:

1. Apparatus comprising:
    a microlithography projection lens system having a numerical aperture of 0.7 or more and comprising refractive lens elements positioned to image radiation from a mask to a wafer, the radiation having a diameter that varies as it is imaged from the mask to the wafer, wherein the lens elements are positioned to image the radiation from the mask to the wafer with only one clearly defined local minimum in the diameter of the imaged radiation and configured for use with radiation from an excimer laser operating at or below about 248 nm.

2. The apparatus of claim 1, wherein at least one of the refractive lens elements comprises an aspherical surface.

3. The apparatus of claim 2, wherein the aspherical surface is positioned between the mask and the clearly defined local minimum.

4. The apparatus of claim 2, wherein the aspherical surface is described mathematically by:

$$P(h) = \frac{\delta h^2}{1 + \sqrt{1-(1-EX)\delta^2 h^2}} + C_1 h^4 + \ldots + C_n h^{2n+2},$$

with $\delta = 1/R$, wherein R is paraxial curvature and P is sag as a function of radius h.

5. The apparatus of claim 1, wherein the refractive lens elements comprise at least one element made of quartz glass.

6. The apparatus of claim 1, wherein the refractive lens elements comprise at least one element made of calcium fluoride.

7. The apparatus of claim 1, wherein the microlithography projection lens comprises an aperture stop between the clearly defined local minimum and the wafer.

8. The apparatus of claim 1, wherein the microlithography projection lens system provides a reduced image of the mask on the wafer.

9. The apparatus of claim 8, wherein the reduced image has a reduction factor of 4 to 1.

10. The apparatus of claim 9, wherein the lens elements produce a second shallow local minimum in the diameter of the imaged radiation.

11. The apparatus of claim 1, wherein the microlithography projection lens further comprises an aperture stop.

12. The apparatus of claim 1, wherein the microlithography projection lens defines a distance between the mask and the wafer of about 1000 mm.

13. A method comprising fabricating a semiconductor device using the apparatus of claim 1.

14. Apparatus comprising:
a microlithography projection lens system having a numerical aperture of 0.7 or more and comprising refractive lens elements positioned to image radiation from a mask to a wafer,
the refractive lens elements consisting essentially of:
a first lens group following the mask, having positive refractive power, and comprising only one convex portion;
a second lens group following the first lens group, having negative refractive power, and comprising only one constriction portion where radiation propagating from the object side to the image side has a minimum diameter; and
a third lens group following the second lens group, having positive refractive power, and comprising only one convex portion.

15. The apparatus of claim 14, wherein at least one of the lens groups comprises an aspherical surface.

16. The apparatus of claim 14, wherein the third lens group comprises a shallow constriction portion.

17. The apparatus of claim 14, wherein the refractive lens elements are configured for use with ultraviolet radiation from an excimer laser operating at about 248 nm or less.

18. A method comprising fabricating a semiconductor device using the apparatus of claim 14.

19. A method comprising:
directing UV-radiation to a mask having a pattern;
exposing a light-sensitive layer on a wafer with radiation emerging from the mask;
developing the light-sensitive layer on the wafer,
wherein the exposing comprises imaging the radiation from the mask to the wafer with a numerical aperture of 0.7 or more and with the imaged radiation having only one clearly defined local minimum in diameter between the mask and the wafer and passing through a at least one aspherical surface.

20. The method of claim 19, further comprising fabricating a semiconductor device from the developed wafer.

21. Apparatus comprising:
means for directing UV-radiation to a mask having a pattern; and
means for exposing a light-sensitive layer on a wafer with radiation emerging from the mask,
wherein the exposing comprises imaging the radiation from the mask to the wafer with a numerical aperture of 0.7 or more and with the imaged radiation having only one clearly defined local minimum in diameter between the mask and the wafer and passing through at least one aspherical surface.

22. Apparatus comprising:
a mask holder configured to support a mask having a pattern,
an excimer laser configured to illuminate the mask with radiation at about 248 nm or less; and
a microlithography optical projection lens system configured to direct radiation emerging from the mask to a wafer with a numerical aperture of 0.7 or more,
the radiation passing through refractive lens elements of the microlithography optical projection lens system, having a diameter that varies between the mask and the wafer as it passes through the refractive lens elements, and forming an image of the mask pattern on the wafer,
wherein the refractive lens elements are positioned to image the radiation from the mask to the wafer with only one clearly defined local minimum in the diameter of the radiation.

23. The apparatus of claim 22, wherein the refractive lens elements comprise at least one aspherical surface.

24. Apparatus comprising:
a microlithography projection lens system comprising refractive lens elements for imaging radiation from a mask to a wafer,
the microlithography projection lens system has a numerical aperture of 0.7 or more and only one clearly defined constriction portion where the radiation has a minimum diameter,
wherein the microlithography projection lens system is configured for use with an excimer laser light source operating at or below about 248 nm, and
wherein the refractive lens element closest to the mask has negative refractive power.

25. The apparatus of claim 24, wherein the refractive lens elements comprise an aspherical surface.

26. Apparatus comprising:
a microlithography projection lens system comprising refractive lens elements for imaging radiation from a mask to a wafer,
the microlithography projection lens system has a numerical aperture of 0.7 or more and only one clearly defined constriction portion where the radiation has a minimum diameter,
wherein the microlithography projection lens system is configured for use with an excimer laser light source operating at or below about 248 nm,
wherein the refractive lens elements comprise a first lens group having positive refractive power, a second lens group following the first lens group and having negative refractive power, and a third lens group following the second lens group and having positive refractive power,
wherein the clearly defined constriction portion is located within the second lens group, and
wherein the first lens group comprises at least five elements each having positive refractive power.

27. The apparatus of claim 26, wherein the refractive lens elements comprise an aspherical surface.

28. The apparatus of claim 26, wherein the five elements each having positive refractive power are in sequence.

29. Apparatus comprising:
a microlithography projection lens system comprising refractive lens elements for imaging radiation from a mask to a wafer,
the microlithography projection lens system has a numerical aperture of 0.7 or more and only one clearly defined constriction portion where the radiation has a minimum diameter, wherein the microlithography projection lens system is configured for use with an excimer laser light source operating at or below about 248 nm, wherein the refractive lens elements comprise a first lens group having positive refractive power, a second lens group following the first lens group and having negative refractive power, and a third lens group following the second lens group and having positive refractive power, wherein the clearly defined constriction portion is located within the second lens group, and wherein the second lens group comprises at least two elements each having negative refractive power and positioned between the clearly defined constriction portion and the wafer.

30. The apparatus of claim 29, wherein the second lens group further comprises at least another two elements each having negative refractive power and positioned between the mask and the clearly defined constriction portion and the wafer.

31. The apparatus of claim 30, wherein the second lens group further comprises at least another element having positive refractive power and positioned between the first-mentioned two elements each having negative refractive power and the second-mentioned two elements each having negative refractive power.

32. The apparatus of claim 29, wherein the refractive lens elements comprise an aspherical surface.

33. Apparatus comprising:

a microlithography projection lens system comprising refractive lens elements for imaging radiation from a mask to a wafer, the microlithography projection lens system has a numerical aperture of 0.7 or more and only one clearly defined constriction portion where the radiation has a minimum diameter, wherein the microlithography projection lens system is configured for use with an excimer laser light source operating at or below about 248 nm, and wherein the microlithography projection lens has a maximal optically free diameter greater than 0.2 times a distance from an object side object plane and an image side image plane into which said object plane is imaged by said optical projection lens.

34. The apparatus of claim 33, wherein the refractive lens elements comprise an aspherical surface.

* * * * *

UNITED STATES PATENT AND TRADEMARK OFFICE
CERTIFICATE OF CORRECTION

| | | |
|---|---|---|
| PATENT NO. | : 6,930,837 B2 | Page 1 of 1 |
| APPLICATION NO. | : 10/833840 | |
| DATED | : August 16, 2005 | |
| INVENTOR(S) | : David R. Shafer and Wilhelm Ulrich | |

It is certified that error appears in the above-identified patent and that said Letters Patent is hereby corrected as shown below:

Column 2, line 23, change "$\lambda 157$ nm" to read -- $\lambda = 157$ nm --; line 28, change "7 times 20" to read -- 7 x 20 --; line 29, change "15 times 30" to read -- 15 x 30 --.

Column 4, line 15, change "$C_1 = 0.178710 * 10\text{--}12\text{-}$" to read -- $C_1 = 0.178710 * 10^{-12}$ --; line 18, change "ad" to read -- and --; line 29, change "me" to read -- be --.

Column 5, line 6, change "claim 9" to read -- claim 1 --; line 53, change "through a" to read -- through --.

Signed and Sealed this

Twenty-sixth Day of September, 2006

JON W. DUDAS
*Director of the United States Patent and Trademark Office*